(12) United States Patent
Son et al.

(10) Patent No.: US 6,858,326 B2
(45) Date of Patent: Feb. 22, 2005

(54) BLUE ELECTROLUMINESCENT POLYMER AND ORGANIC ELECTROLUMINESCENCE DEVICE USING THE SAME

(75) Inventors: Jhun Mo Son, Daejun-Shi (KR); Ji Hoon Lee, Daejun-Shi (KR); In Nam Kang, Daejun-Shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/274,048

(22) Filed: Oct. 21, 2002

(65) Prior Publication Data

US 2003/0096137 A1 May 22, 2003

(30) Foreign Application Priority Data

Nov. 16, 2001 (KR) .......................................... 2001-71245

(51) Int. Cl.[7] ............................ C09K 11/06; H01J 63/04
(52) U.S. Cl. .................. 428/690; 428/917; 252/301.16; 313/504; 313/506
(58) Field of Search ................................ 428/690, 917; 252/301.16; 313/504, 506

(56) References Cited

U.S. PATENT DOCUMENTS

| | | | | |
|---|---|---|---|---|
| 5,635,308 A | * | 6/1997 | Inoue et al. ................. | 428/696 |
| 5,972,247 A | * | 10/1999 | Shi et al. .................... | 252/583 |
| 5,998,045 A | * | 12/1999 | Chen et al. ................. | 428/690 |
| 6,268,072 B1 | * | 7/2001 | Zheng et al. ................ | 428/690 |

FOREIGN PATENT DOCUMENTS

| | | |
|---|---|---|
| EP | 0 681 019 A2 | 11/1995 |
| EP | 0 952 200 A2 | 10/1999 |
| EP | 1 088 875 A2 | 4/2001 |
| JP | 11-329732 | 11/1999 |

* cited by examiner

Primary Examiner—Rena Dye
Assistant Examiner—Camie S Thompson
(74) Attorney, Agent, or Firm—Lee & Sterba, P.C.

(57) ABSTRACT

A blue electroluminescent polymer comprising diphenylanthracene units in a main chain of polymer and an organic electroluminescence device using the blue electroluminescent polymer, to provide improved luminescent properties.

9 Claims, 6 Drawing Sheets

BLUE ELECTROLUMINESCENT POLYMER AND ORGANIC ELECTROLUMINESCENCE DEVICE USING THE SAME

BACKGROUND OF THE INVENTION

1. Field of the Invention

The present invention relates to a blue electroluminescent polymer and an organic electroluminescence device using the same. More particularly, the invention relates to a blue electroluminescent polymer comprising diphenylanthracene units in a main chain of a polymer and an organic electroluminescence device using the blue electroluminescent polymer.

2. Description of the Related Art

As the first electroluminescent device using organic material, C. W. Tang from Eastman Kodak company reported a device having a multilayered structure in which each layer has a different function. Since the multilayered structure device has advantages including lightness, thinness, various colors, fast switching speed and high luminance under low driving voltage, many studies on such multilayered devices have been ongoing in the past decade. As a result, great advances in the performance of the device, e.g., a balanced charge injection by using the multilayered structure, color tuning and improved quantum efficiency by a doping process, and a new electrode material made of an alloy, etc., have been developed in a relatively short period of time.

An organic electroluminescence display typically is classified either as a device using low molecular weight compounds, or a device using polymers, in terms of material and manufacturing process thereof. Low molecular weight compounds usually are layered on a device by a vacuum deposition process. The device using a low molecular weight compound is advantageous in that the purification of materials is easy, high purity thereof is possible, and color pixels can be easily attained. However, for practical use of the device, there still exist many items that can be improved to improve the performance of the device in terms of quantum efficiency, thermal/mechanical stability of thin film, color purity, lifetime etc.

Various studies on electroluminescent displays using low molecular weight compounds have been undertaken in many countries, especially in Japan and U.S.A. For example, Idemitsu-Kosan Co., Ltd.(Japan) first exhibited a 10 inch full color organo-electroluminescent display manufactured in a color mode using a color changing medium in 1997. Pioneer Corporation(Japan) presented a 5 inch PM (Passive Matrix) full color organic electroluminescence display. Recently, Pioneer Corporation and Motorola Inc. have arrived at an agreement concerning the mass production of cellular phones employing the organic electroluminescence display in a terminal. It suggests that the commercialization of the electroluminescent display using low molecular weight compounds will be possible soon.

On the other hand, studies for developing electroluminescent devices using polymer have been carried out intensively since a Cambridge group reported in 1990 that light is emitted when electricity is applied to poly(1,4-phenylene vinylene)(PPV), which is a π-conjugated polymer. Generally, π-conjugated polymers have an alternating structure of single bonds (σ-bonds) and double bonds (π-bonds) so that the polymer has delocalized π-electrons capable of freely moving along the polymer chain. The π-conjugated polymer has semiconductive properties, and visible light corresponding to the HOMO-LUMO energy band-gap of polymers can be easily obtained in the range of whole UV-Visible spectra region, through molecular design of the π-conjugated polymer when the polymer is employed in a light-emitting layer of the electroluminescent device. In addition, thin films of the polymer can simply be formed on the device by a spin coating or a printing process. Accordingly, the manufacturing process of the device is very simple and cost-effective. Furthermore, the mechanical properties of the thin film of polymer are excellent due to its high glass transition temperature($T_g$). Therefore, it is expected that devices using polymers have more advantages from a commercial point of view than the electroluminescent display using low molecular weight compounds.

However, devices using polymers have problems in that their luminance is lower than the electroluminescent device using low molecular weight compounds, and their durability is weak due to the deterioration of luminescent polymer. The deterioration of polymer can be caused by defects present in the polymer chain, which can occur during the synthesis of the polymer. In addition, the purification of polymer is difficult so that polymers of high purity are not easily obtainable.

In order to overcome these problems, a polymerization process capable of minimizing defects in the polymer, and a purification process capable of removing impurities present in the polymer, are needed. The polymer prepared by these processes can further improve the performance of the device using the polymer.

The description herein of various problems and disadvantages of known apparatus, compounds, and methods is in no way intended to limit the scope of the invention. Indeed, various aspects of the invention may include some of the known apparatus, compounds, and/or methods without suffering from the same problems or disadvantages.

SUMMARY OF THE INVENTION

It is a feature of the present invention to provide a novel blue electroluminescent polymer with improved luminescent properties. It is another feature of the present invention to provide an organic electroluminescence device into which the blue electroluminescent polymer is introduced as a light-emitting layer.

In accordance with one aspect of an embodiment of the present invention, there is provided a blue electroluminescent polymer, represented by the following formula (1):

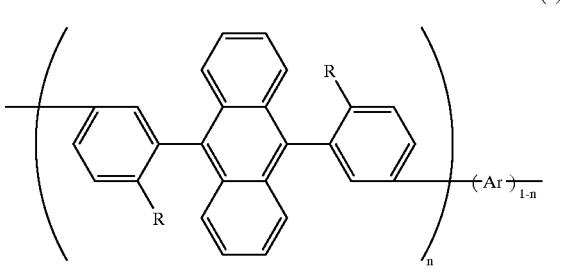

(1)

wherein Ar is a $C_{6-26}$ aromatic group, or a $C_{4-14}$ heteroaromatic group which contains at least one heteroatom in the aromatic ring, where the aromatic group and the heteroaromatic group may be unsubstituted or substituted with at least one $C_{1-12}$ linear, branched or cyclic alkyl group, alkoxy group or amine group; R is a hydrogen atom, a $C_{1-12}$ linear, branched or cyclic alkyl group or alkoxy group, or a $C_{6-14}$ aromatic group which may be unsubstituted or substituted with at least one $C_{1-12}$ linear, branched or cyclic alkyl group, alkoxy group or amine group; and n is a real number from 0.01 to 0.99.

In accordance with another aspect of an embodiment of the present invention, there is provided an organo-electroluminescent device into which the blue electroluminescent polymer is introduced as a light-emitting layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
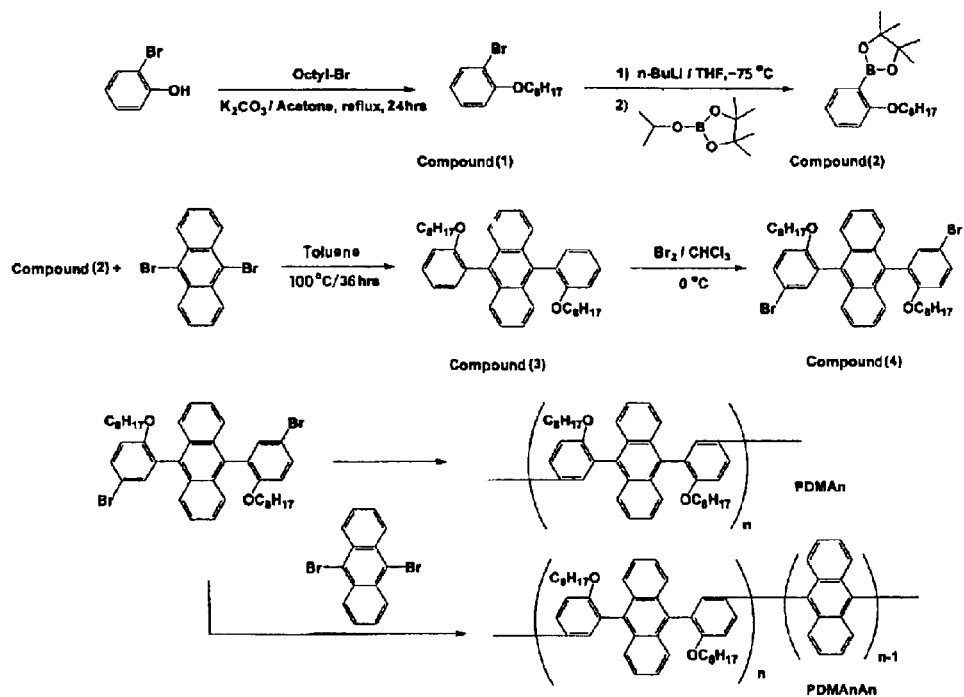
FIG. 1 is a schematic reaction scheme illustrating the preparation of a blue electroluminescent polymer according to Preparative Example 1 of the present invention.

Priority Korean Patent Application No. 2001-71245 filed Nov. 16, 2001, entitled Blue Electroluminescent Polymer And Organo-electroluminescent Device Manufactured By Using The Same, is incorporated by reference herein in its entirety.

In the present invention, there is provided a blue electroluminescent polymer in which diphenylanthracene units having blue luminescent property are introduced into a main chain of polymer, represented by the following formula (1):

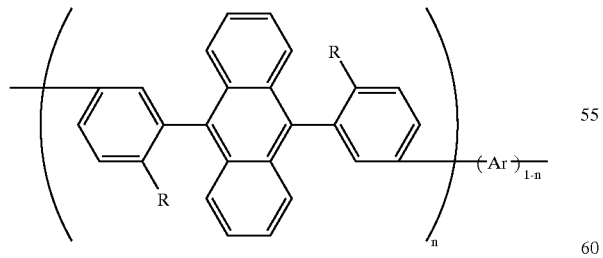

(1)

wherein Ar is a $C_{6-26}$ aromatic group, or a $C_{4-14}$ heteroaromatic group which contains at least one heteroatom in the aromatic ring, where the aromatic group and the heteroaromatic group may be unsubstituted or substituted with at least one a $C_{1-12}$ linear, branched or cyclic alkyl group, alkoxy group or amine group; R is a hydrogen atom, a $C_{1-12}$ linear, branched or cyclic alkyl group or alkoxy group, or a $C_{6-14}$ aromatic group which may be unsubstituted or substituted with at least one $C_{1-12}$ linear, branched or cyclic alkyl group, alkoxy group or amine group; and n is a real number from 0.01 to 0.99.

The arylene(Ar) unit contained in a main chain of the blue luminescent polymer according to the present invention may be selected from the group consisting of structures represented by the following formulas (2) and (3):

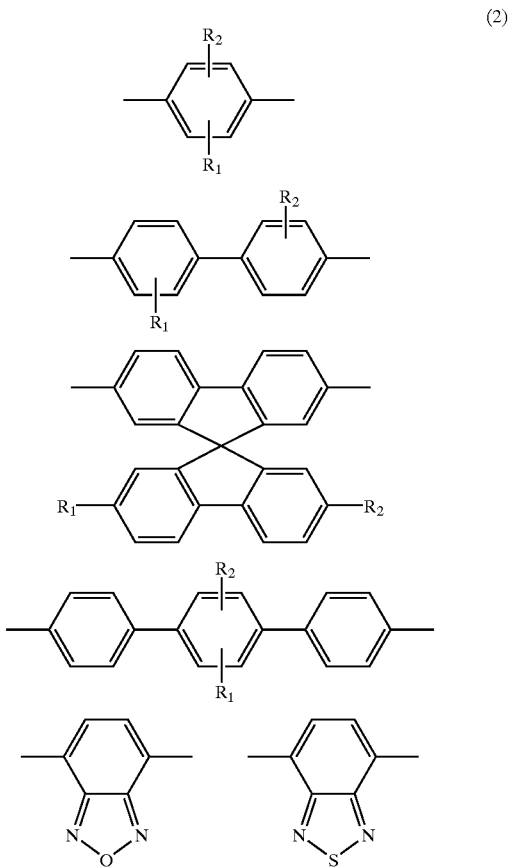

(2)

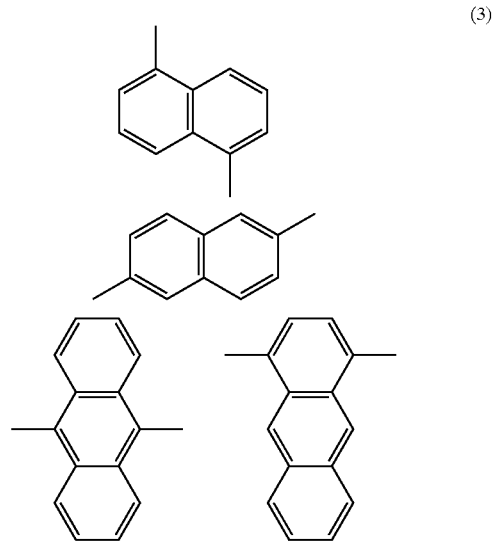

(3)

-continued

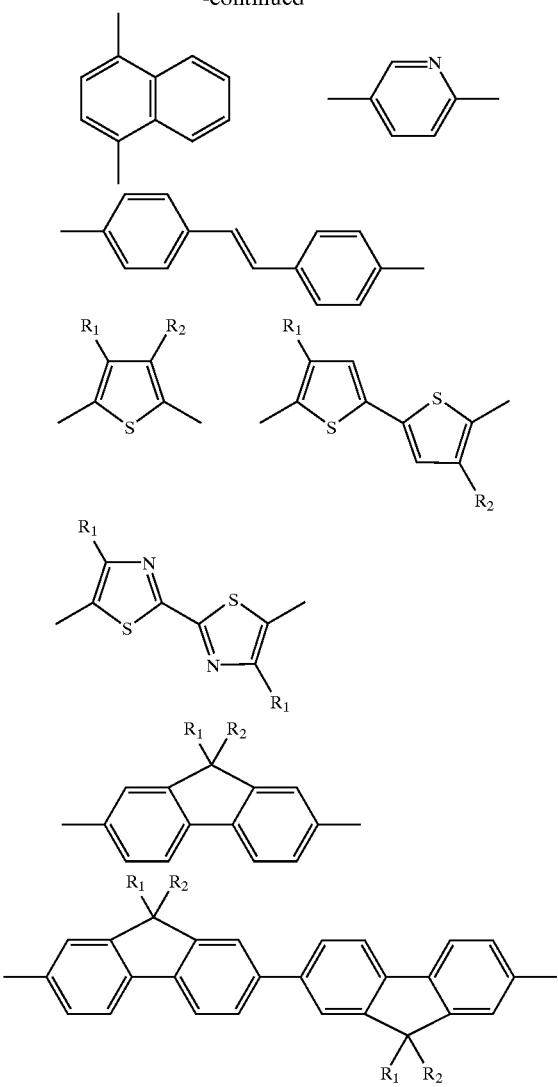

wherein $R_1$ and $R_2$ are independently a $C_{1-12}$ linear, branched or cyclic alkyl group, alkoxy group or amine group. Preferably, the arylene (Ar) unit has an anthracene structure.

The blue electroluminescent polymer according to the present invention contains diphenylanthracene units in a main chain of the polymer so that the devices using the polymer can be driven under a low voltage with high luminance. In particular, diphenylanthracene substituted with at least one alkoxy group has a broad band-gap which is advantageous in realizing blue electroluminescence of the polymer. Accordingly, it is expected that the polymer comprising diphenylanthracene substituted with one or more alkoxy groups can replace alkylfluorene derivatives which have been widely investigated. In addition, since the diphenylanthracene containing alkoxy group has a twisted structure, it can control the current flow upon driving of the device.

The number average molecular weight (Mn) of the blue electroluminescent polymer according to the present invention is preferably within the range from about 10,000 to about 200,000, as determined by GPC analysis. The number average molecular weight acts as an important factor affecting the thin film formation and lifetime of the device. When the number average molecular weight is less than 10,000, crystallization may occur upon manufacturing and driving of the device. On the other hand, it is difficult to prepare the blue electroluminescent polymer having a number average molecular weight exceeding 200,000 by a Pd(0) or Ni(0)-mediated aryl coupling reaction.

The molecular weight distribution of the blue electroluminescent polymer preferably is within the range from about 1.5 to about 5. A narrower molecular weight distribution of electroluminescent polymer is advantageous in terms of electroluminescent properties (in particular, lifetime of the device).

The organic electroluminescence device according to the present invention can be manufactured by forming a light-emitting layer that contains the blue electroluminescent polymer. The organic electroluminescence device can have a structure selected from the group consisting of anode/light-emitting layer/cathode, anode/buffer layer/light-emitting layer/cathode, anode/hole transport layer/light-emitting layer/cathode, anode/buffer layer/hole transport layer/light-emitting layer/cathode, anode/buffer layer/hole transport layer/light-emitting layer/electron transport layer/cathode, anode/buffer layer/hole transport layer/light-emitting layer/hole blocking layer/cathode structure, etc., but is not particularly limited to these structures.

For the buffer layer, there may be used material commonly used in the art. Preferably copper phthalocyanine, polythiophene, polyaniline, polyacetylene, polypyrrole, polyphenylene vinylene, or derivatives thereof are used. For the hole transport layer, there may be used materials commonly used in the are and preferably polytriphenylamine is used. For the electron transport layer, there may be used materials commonly used in the art, and preferably polyoxadiazole is used. For the hole blocking layer, there may be used materials commonly used in the art, and preferably LiF and $MgF_2$ is used.

The organo-electroluminescence device according to the present invention can be manufactured in accordance with conventional apparatuses and methods in the art. Those skilled in the art are capable of manufacturing an organic electroluminescence device of the present invention using the guidelines provided herein.

The present invention now will be described in more detail with reference to the following Examples. However, these examples are provided for the purpose of illustration and not of limitation.

PREPARATIVE EXAMPLE 1

Preparation of Blue Electroluminescent Polymer

FIG. 1 is a schematic reaction scheme illustrating preparation of the first embodiment of blue electroluminescent polymer according to the present invention. Referring to FIG. 1, a method for preparing the polymer will be described in detail below.

Preparation of Compound (1)

About 48.4 g (350 mmol) of $K_2CO_3$ was added to a solution of 50 g (290 mmol) of 2-bromophenol in 500 ml of acetone, and then 73.3 g (380 mmol) of 1-bromooctane was added thereto. The mixture was refluxed for 24 hours. After the reaction was completed, the reaction mixture was extracted with water and $CHCl_3$(2:1) to remove $K_2CO_3$. The organic layer was dried using $MgSO_4$ for concentration and passed through a silica gel column (eluent: hexane). Unreacted 1-bromooctane was distilled off under reduced pressure to prepare 80 g (yield: 96%) of the product. The structure of the product was identified through $^1$H-NMR analysis.

2) Preparation of Compound (2)

Approximately 100 ml (1.2 eq) of n-butyl lithium was slowly added to a solution of 38 g (130 mmol) of Compound (1) prepared above in 150 ml of anhydrous THF at −75° C. The mixture was stirred for 1 hour. Then, 32.9 g (1.3 eq) of 2-isopropoxy-4,4,5,5-tetramethyl-1,3,2-dioxaborolane was added to the mixture, and reacted for 1 hour. After the reaction was completed, the reaction mixture was extracted with water and ethyl acetate (2:1) three times. The organic layer was dried using $MgSO_4$, and concentrated. Unreacted 2-isopropoxy-4,4,5,5-tetramethyl-1,3,2-dioxaborolane was distilled off under reduced pressure to prepare the product.

3) Preparation of Compound (3)

Compound (2) (33 g (2.3 eq)), 17 g (0.05 mol) of 9,10-dibromoanthracene, 0.87 g (1.5 mol % vs. 9,10-dibromoanthracene) of tetrakistriphenylphosphine palladium(0)($Pd(pph_3)_4$) and 150 ml of 2M sodium carbonate aqueous solution were charged into a 500 ml of round-bottomed flask, and then 100 ml of anhydrous toluene was added thereto to dissolve solid components. The mixture was reacted at 100° C. for 36 hours. After the reaction was completed, the reaction mixture was extracted with water and ethyl acetate (2:1). The organic layer was dried using $MgSO_4$, and activated carbon was added thereto. After the mixture was stirred for 2 hours until the mixture was decolorized, it was filtered, concentrated, and then re-crystallized in a mixture of acetone and methanol (1:1) to prepare 24 g (yield: 84%) of the product.

4) Preparation of Compound (4)

Bromine (2.8 g (2.1 eq)) was slowly added to a solution of 5 g (8.5 mmol) of Compound (3) prepared above in 100 ml of chloroform while maintaining the reaction temperature at 0° C., and then the mixture was stirred. The addition of bromine was stopped after the Compound (3) was completely removed. The mixture was stirred for 30 min, and then the reaction was quenched by the addition of a small amount of acetone. The reaction mixture was washed with water, dried using $MgSO_4$ for concentration and re-precipitated in methanol to prepare 4.8 g (yield: 75%) of the product.

5) Preparation of Electroluminescent Polymer 5-1) Preparation of Poly(dioctyloxyphenylanthracene) [PDMAn]

First, a Schlenk flask was vacuumed and refluxed with nitrogen gas several times to completely remove moisture. Then, 880 mg (3.2 mmol) of bis-1,5-cyclooctadiene)nickel(0)($Ni(COD)_2$) and 500 mg (3.2 mmol) of bipyridal were charged into the Schlenk flask in a glove box, and then the flask was vacuumed and refluxed with nitrogen gas several times again. About 10 ml of anhydrous N,N-dimethylformamide (DMF), 346 mg (3.2 mmol) of 1,5-cyclooctadiene (COD), and 10 ml of anhydrous toluene were added to the flask under nitrogen atmosphere. After the mixture was stirred at 80° C. for 30 min, a diluted solution of 1.19 g (1.60 mmol) of Compound (4) prepared above in 10 ml of toluene was added to the mixture. Next, 10 ml of toluene was added to the mixture while washing materials adhered to the flask wall, and then the mixture was stirred at 80° C. for 4 days. After 4 days, 1 ml of bromopentafluorobenzene was added to the mixture and stirred at 80° C. for 1 day. After stirring, the temperature was lowered to 60° C.

Figure 2:
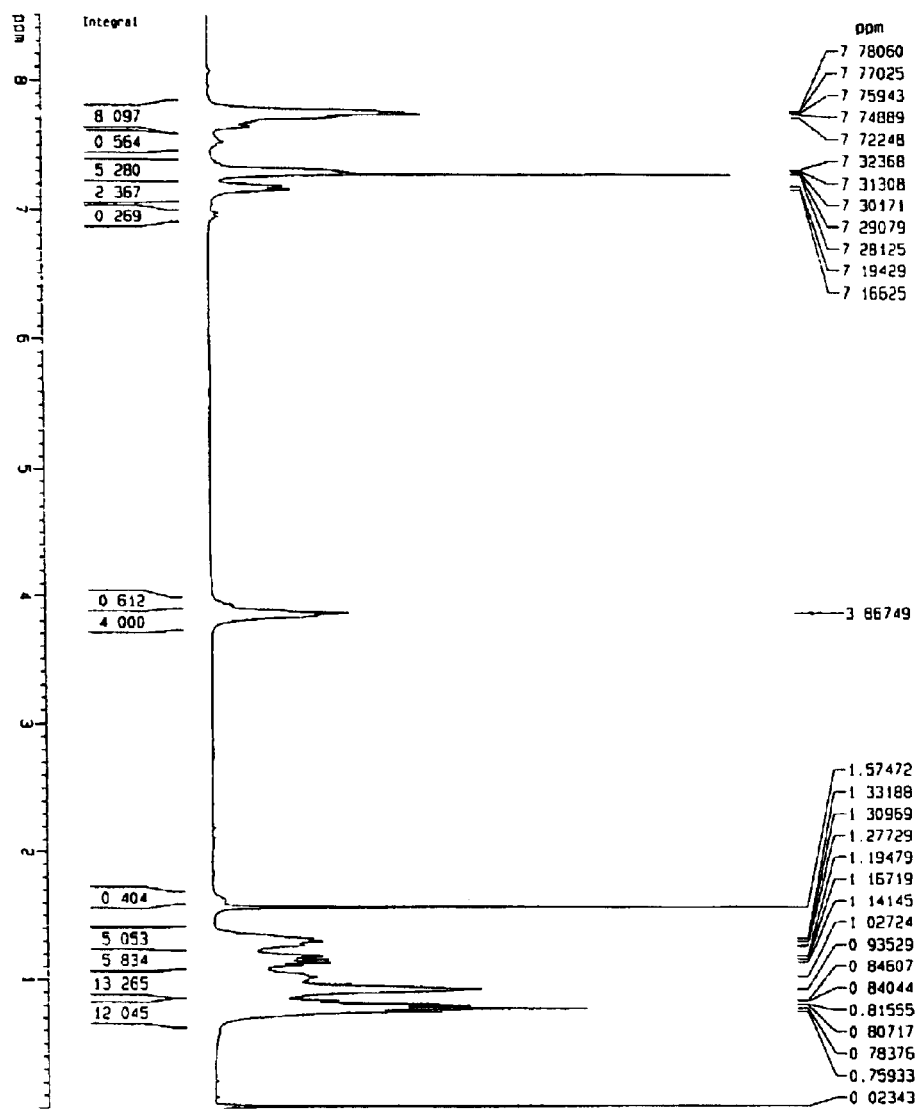
FIG. 2 is a $^1$H-NMR spectrum of PDMAn prepared in Preparative Example 1 of the present invention.

The reaction mixture was poured onto a mixture of HCl, acetone, and methanol (1:1:2) to form precipitates, and then stirred for more than 12 hours. The precipitates were dissolved in a small amount of chloroform, and then re-precipitated in methanol. After the precipitates thus formed were collected through a gravity filter, Soxhlet extraction was performed using methanol and chloroform, sequentially. The chloroform solution was concentrated, and then re-precipitated in methanol to prepare 620 mg of poly(dioctyloxyphenylanthracene). The structure of the final product was identified through $^1$H-NMR (see, FIG. 2). From GPC analysis, the number average molecular weight was 30,000, and the molecular weight distribution was 2.02.

5-2) Preparation of Poly(dioctyloxyphenylanthracene-co-anthracene)(80:20) [PDMAnAn20]

First, a Schlenk flask was vacuumed and refluxed with nitrogen gas several times to completely remove moisture. Then, 880 mg (3.2 mmol) of $Ni(COD)_2$ and 500 mg (3.2 mmol) of bipyridyl were charged into the Schlenk flask in a glove box, and then the flask was vacuumed and refluxed with nitrogen gas several times again. About 10 ml of anhydrous DMF, 346 mg (3.2 mmol) of COD and 10 ml of anhydrous toluene were added to the flask under nitrogen atmosphere. After the mixture was stirred at 80° C. for 30 min, a diluted solution of 991 mg (1.28 mmol) of Compound (4) prepared above and 108 mg (0.32 mmol) of 9,10-dibromoanthracene in 10 ml of toluene was added to the mixture. Next, 10 ml of toluene was added to the mixture while washing materials adhered to the flask wall, and then the mixture was stirred at 80° C. for 4 days. After 4 days, 1 ml of bromopentafluorobenzene was added to the mixture and stirred at 80° C. for 1 day. After stirring, the temperature was lowered to 60° C.

The reaction mixture was poured onto a mixture of HCl, acetone, and methanol (1:1:2) to form precipitates, and then stirred for more than 12 hours. The precipitates were dissolved in a small amount of chloroform, and then re-precipitated in methanol. After the precipitates thus formed were collected through a gravity filter, Soxhlet extraction was performed using methanol and chloroform, sequentially. The chloroform solution was concentrated, and then re-precipitated in methanol to prepare 350 mg of poly(dioctyloxyphenylanthracene-co-anthracene) (80:20). The structure of the final product was identified through $^1$H-NMR. As a result of analyzing the polymer by GPC, the number average molecular weight was 29,000, and the molecular weight distribution was 2.37.

5-3) Preparation of Poly(dioctyloxyphenylanthracene-co-anthracene) (90:10) [PDMAnAn10]

First, a Schlenk flask was vacuumed and refluxed with nitrogen gas several times to completely remove moisture. Then, 880 mg (3.2 mmol) of $Ni(COD)_2$ and 500 mg (3.2 mmol) of bipyridyl were charged into the Schlenk flask in a glove box, and then the flask was vacuumed and refluxed with nitrogen gas several times again. About 10 ml of anhydrous DMF, 346 mg (3.2 mmol) of COD and 10 ml of anhydrous toluene were added to the flask under nitrogen atmosphere. After the mixture was stirred at 80° C. for 30 min, a diluted solution of 1,115 mg (1.44 mmol) of Compound (4) prepared above and 54 mg (0.16 mmol) of 9,10-dibromoanthracene in 10 ml of toluene was added to the mixture. Next, 10 ml of toluene was added to the mixture while washing materials adhered to the flask wall, and then the mixture was stirred at 80° C. for 4 days. After 4 days, 1 ml of bromopentafluorobenzene was added to the mixture and stirred at 80° C. for 1 day. After stirring, the temperature was lowered to 60° C.

The reaction mixture was poured onto a mixture of HCl, acetone, and methanol (1:1:2) to form precipitates, and then stirred for more than 12 hours. The precipitates were dissolved in a small amount of chloroform, and then re-precipitated in methanol. After the precipitates thus formed were collected through a gravity filter, Soxhlet extraction was performed using methanol and chloroform, sequentially. The chloroform solution was concentrated, and then re-precipitated in methanol to prepare 290 mg of poly(dioctyloxyphenylanthracene-co-anthracene) (90:10). The structure of the final product was identified through $^1$H-NMR. From GPC analysis, the number average molecular weight was 28,000, and the molecular weight distribution was 2.41.

5-4) Preparation of Poly(dioctyloxyphenylanthracene-co-dioctyloxybiphenyl) (90:10) [PDMAnDMBP10]

First, a Schlenk flask was vacuumed and refluxed with nitrogen gas several times to completely remove moisture. Then, 880 mg (3.2 mmol) of Ni(COD)$_2$ and 500 mg (3.2 mmol) of bipyridyl were charged into the Schlenk flask in a glove box, and then the flask was vacuumed and refluxed with nitrogen gas several times. About 10 ml of anhydrous DMF, 346 mg (3.2 mmol) of COD and 10 ml of anhydrous toluene were added to the flask under nitrogen atmosphere. After the mixture was stirred at 80° C. for 30 min, a diluted solution of 1,115 mg (1.44 mmol) of Compound (4) prepared above and 90 mg (0.16 mmol) of 4,4'-dibromo-2,2'-dioctyloxybiphenyl in 10 ml of toluene was added to the mixture. Next, 10 ml of toluene was added to the mixture while washing materials adhered to the flask wall, and then the mixture was stirred at 80° C. for 4 days. After 4 days, 1 ml of bromopentafluorobenzene was added to the mixture and stirred at 80° C. for 1 day. After stirring, the temperature was lowered to 60° C.

Figure 3:
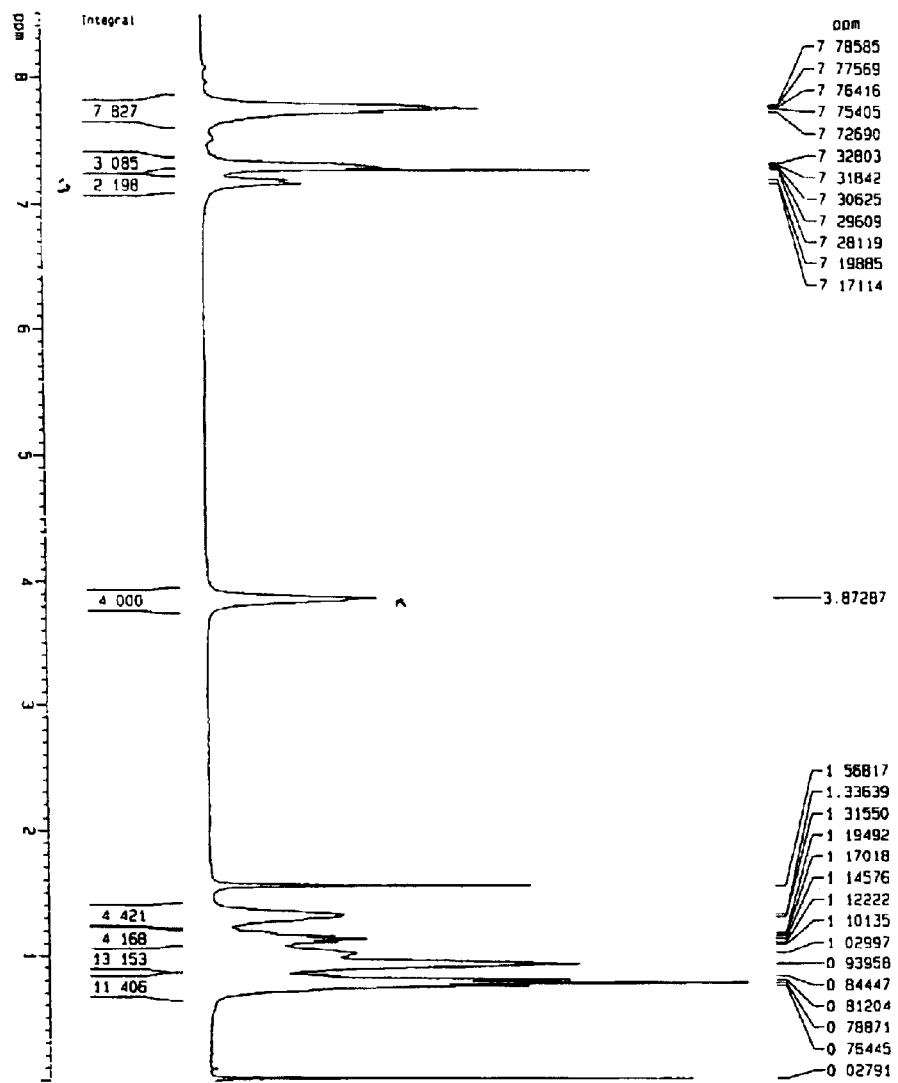
FIG. 3 is a $^1$H-NMR spectrum of PDMAnDMBP10 prepared in Preparative Example 1 of the present invention.

The reaction mixture was poured onto a solution of HCl:acetone:methanol (1:1:2) to form precipitates, and then stirred for more than 12 hours. The precipitates were dissolved in a small amount of chloroform, and then re-precipitated in methanol. After the precipitates thus formed were collected through a gravity filter, Soxhlet extraction was performed using methanol and chloroform, sequentially. The chloroform solution was concentrated, and then re-precipitated in methanol to prepare 460 mg of poly(dioctyloxyphenylanthracene-co-dioctyloxybiphenyl) (90:10). The structure of the final product was identified through $^1$H-NMR (see, FIG. 3). From GPC analysis, the number average molecular weight was 34,000, and the molecular weight distribution was 2.24.

5-5) Preparation of Poly(dioctyloxyphenylanthracene-co-dioctyloxybiphenyl) (70:30) [PDMAnDMBP30]

First, a Schlenk flask was vacuumed and refluxed with nitrogen gas several times to completely remove moisture. Then, 880 mg (3.2 mmol) of Ni(COD)$_2$ and 500 mg (3.2 mmol) of bipyridyl were charged into the Schlenk flask in a glove box, and then the flask was vacuumed and refluxed with nitrogen gas several times again. About 10 ml of anhydrous DMF, 346 mg (3.2 mmol) of COD and 10 ml of anhydrous toluene were added to the flask under nitrogen atmosphere. After the mixture was stirred at 80° C. for 30 min, a diluted solution of 867 mg (1.12 mmol) of Compound (4) prepared above and 273 mg (0.48 mmol) of 4,4'-dibromo-2,2'-dioctyloxybiphenyl in 10 ml of toluene was added to the mixture. Next, 10 ml of toluene was added to the mixture while washing materials adhered to the flask wall, and then the mixture was stirred at 80° C. for 4 days. After 4 days, 1 ml of bromopentafluorobenzene was added to the mixture and stirred at 80° C. for 1 day. After stirring, the temperature was lowered to 60° C.

The reaction mixture was poured onto a mixture of HCl, acetone, and methanol (1:1:2) to form precipitates, and then stirred for more than 12 hours. The precipitates were dissolved in a small amount of chloroform, and then re-precipitated in methanol. After the precipitates thus formed were collected through a gravity filter, Soxhlet extraction was performed using methanol and chloroform, sequentially. The chloroform solution was concentrated, and then re-precipitated in methanol to prepare 460 mg of poly(dioctyloxyphenylanthracene-co-dioctyloxybiphenyl) (70:30). The structure of the final product was identified through $^1$H-NMR. From GPC analysis, the number average molecular weight was 32,000, and the molecular weight distribution was 1.95.

5-6) Preparation of poly(dioctyloxyphenylanthracene-co-dioctylfluorene) (5:95) [PDMAnAF95]

First, a Schlenk flask was vacuumed and refluxed with nitrogen gas several times to completely remove moisture. Then, about 880 mg (3.2 mmol) of Ni(COD)$_2$ and 500 mg (3.2 mmol) of bipyridyl were charged into the Schlenk flask in a glove box, and then the flask was vacuumed and refluxed with nitrogen gas several times again. About 10 ml of anhydrous DMF, 346 mg (3.2 mmol) of COD and 10 ml of anhydrous toluene were added to the flask under nitrogen atmosphere. After the mixture was stirred at 80° C. for 30 min, a diluted solution of 60 mg (0.08 mmol) of Compound (4) prepared above and 834 mg (1.52 mmol) of 2,6-dibromo-9,9'-dioctyloxyfluorene in 10 ml of toluene was added to the mixture. Next, 10 ml of toluene was added to the mixture while washing materials adhered to the flask wall, and then the mixture was stirred at 80° C. for 4 days. After 4 days, 1 ml of bromopentafluorobenzene was added to the mixture and stirred at 80° C. for 1 day. After stirring, the temperature was lowered to 60° C.

The reaction mixture was poured onto a mixture of HCl, acetone, and methanol (1:1:2) to form precipitates, and then stirred for more than 12 hours. The precipitates were dissolved in a small amount of chloroform, and then re-precipitated in methanol. After the precipitates thus formed were collected through a gravity filter, Soxhlet extraction was performed using methanol and chloroform, sequentially. The chloroform solution was concentrated, and then re-precipitated in methanol to prepare 310 mg of poly(dioctyloxyphenylanthracene-co-dioctylfluorene) (5:95). The structure of the final product was identified through $^1$H-NMR. From GPC analysis, the number average molecular weight was 40,000, and the molecular weight distribution was 2.64.

EXAMPLE 1

Evaluation of Optical Properties

Figure 4A:
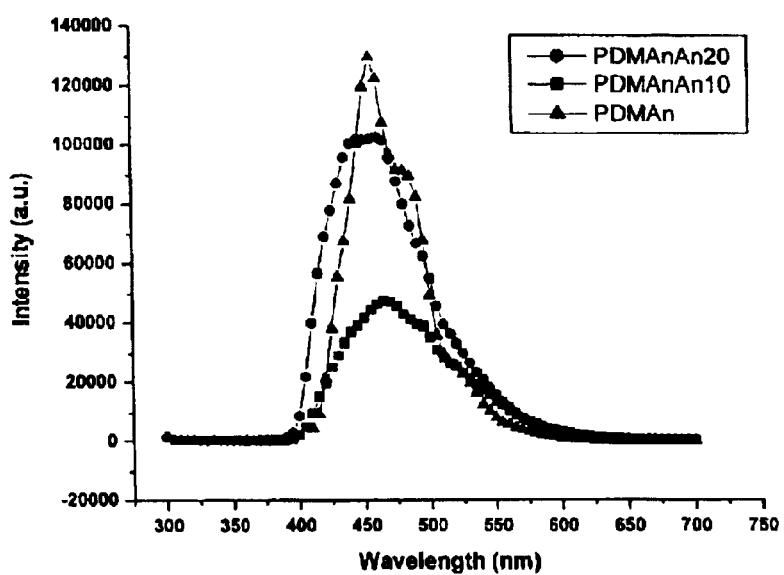
FIGS. 4A and 4B show UV absorption spectra and PL (Photoluminescence) spectra of PDMAn, PDMAnAn10 and PDMAnAn20, respectively, prepared in Preparative Example 1 of the present invention.
Figure 4B:
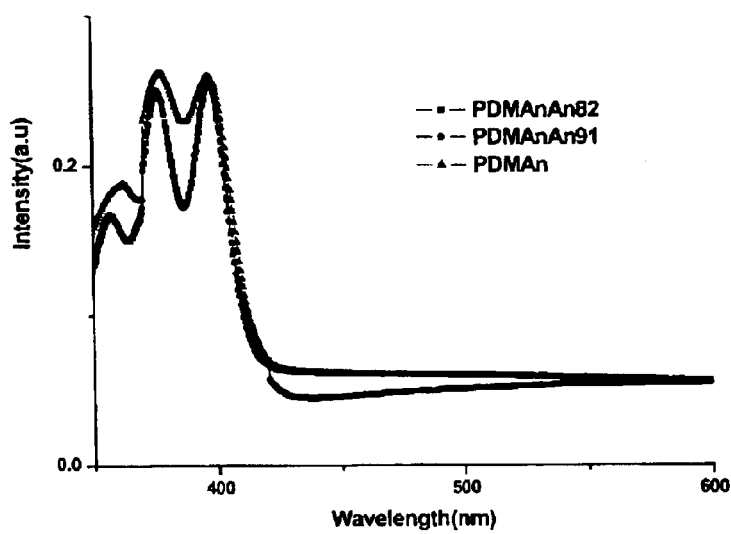

PDMAAn, PDMAnAn10 and PDMAnAn20 prepared in Preparative Example 1 above were dissolved in toluene and then spin-coated on a quartz plate to form polymeric thin films, respectively. UV-Visible spectra and PL (photoluminescence) spectra of the polymer thin films were measured, respectively. The respective results are shown in FIGS. 4A and 4B. The maximum UV absorption peaks of PDMAAn, PDMAnAn10 and PDMAnAn20 were measured to be around 375 nm and 396 nm, and the maximum PL peaks were measured to be within the range from 450 to 460 nm when the maximum absorption wavelength bands were set to the excitation wavelength. Accordingly, it was observed that there was no difference in the optical properties between the three thin films.

EXAMPLE 2

Manufacture of Electroluminescent Device

Figure 5:
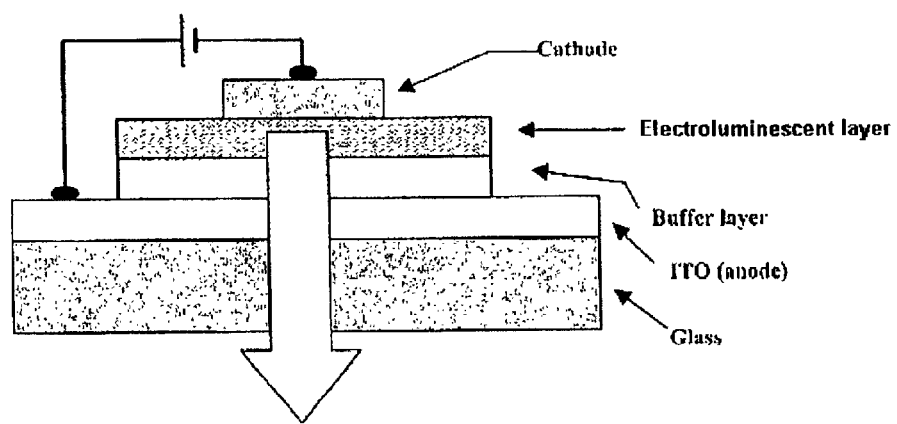
FIG. 5 is a schematic cross-sectional view showing the structure of an electroluminescent device manufactured in Example 2.

Electroluminescent devices were manufactured using PDMAAn, PDMAnAn10 and PDMAnAn20 prepared in Preparative Example 1 above, respectively, in accordance with the following procedure. First, after a transparent electrode substrate, which was a glass substrate coated with ITO (indium-tin oxide), was cleaned. Then, the ITO coating was patterned by using a photoresist resin and an etchant, and the substrate was again cleaned. Batron P 4083 (Bayer) as a conductive buffer layer was coated on the patterned ITO to a thickness of about 500~1100 Å, and then baked at 180° C. for about 1 hour. An organo-electroluminescent polymer solution prepared by dissolving the above luminescent polymer in chlorobenzene or toluene was spin-coated on the buffer layer and baked. The solvent was removed in a vacuum oven to form polymer thin films. At this point in the process, the spin-coating of the polymer solution was carried out after the polymer solution had been passed through a 0.2 mm filter, and the thickness of the polymer thin film was controlled within the range from 50 to 100 nm by changing the concentration of the polymer solution and spin speed. Ca and Al were sequentially deposited on the polymer thin film using a vacuum depositor under a vacuum lower than $4 \times 10^{-6}$ torr. During the deposition, the thickness and the growth speed of the layer were controlled by a crystal sensor. The EL devices thus manufactured were single-layered devices having a structures of ITO/PEDOT(poly(3, 4-ethylenedioxy thiophene)/luminescent polymer/Ca/Al, and had a light-emitting area of 4 mm², respectively. The schematic structure is shown in FIG. 5.

EXAMPLE 3

Evaluation of EL Properties

Figure 6:
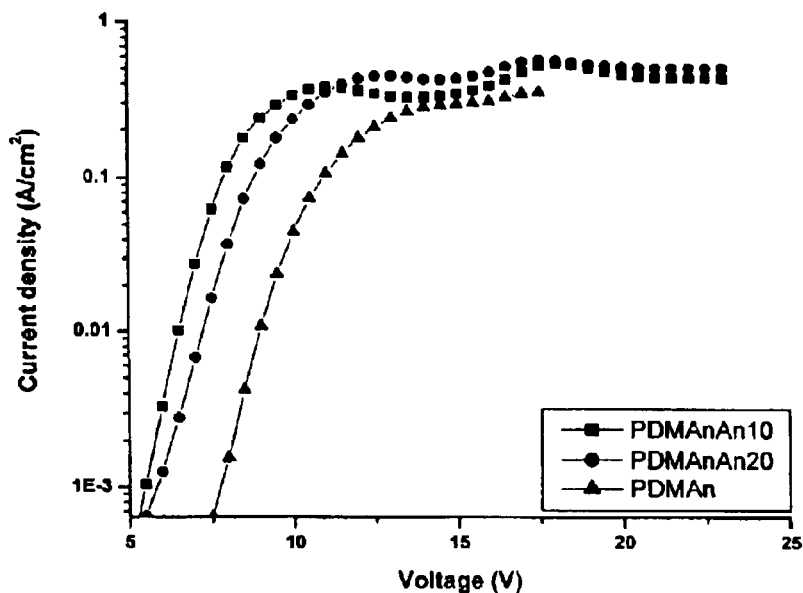
FIG. 6 is a graph showing a voltage-current density relationship, measured by using devices manufactured in Example 2.
Figure 7:
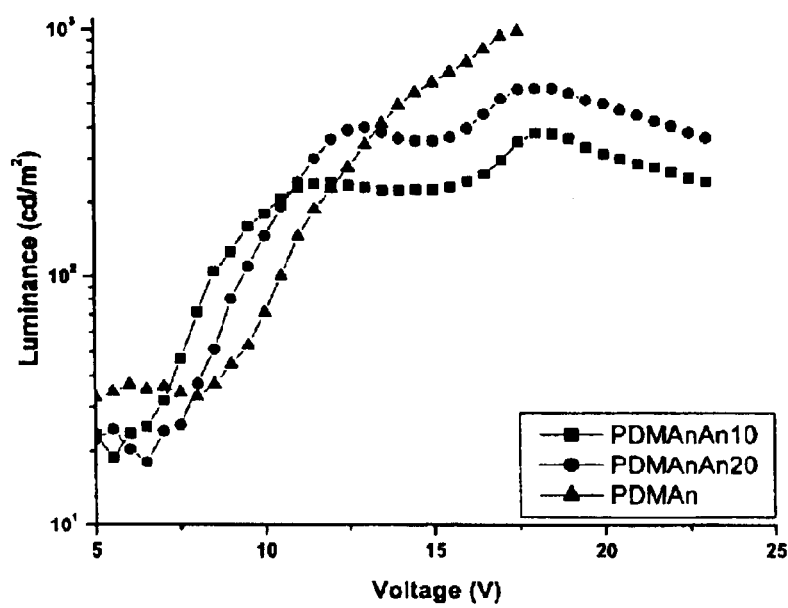
FIG. 7 is a graph showing a voltage-luminance relationship, measured by using devices manufactured in Example 2.

EL(electroluminescence) properties of the devices manufactured in Example 2 were evaluated, and the respective results are shown in FIGS. 6 and 7. The devices all showed typical properties of a rectifying diode. At this time, forward bias voltage, which is a direct voltage, was used as a turn-on voltage. The turn-on voltage of all devices began at 5.5~7.5V (see, FIG. 6). All the devices emitted blue light, and had a maximum luminance of about 300~1000 cd/m² (see, FIG. 7). The maximum quantum efficiency of the devices was about 0.1~0.27 cd/A. In addition, the devices all showed excellent stability, such that the initial voltage-current density characteristics were maintained even through several repeated driving of the devices.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A blue electroluminescent polymer, represented by the following formula (1):

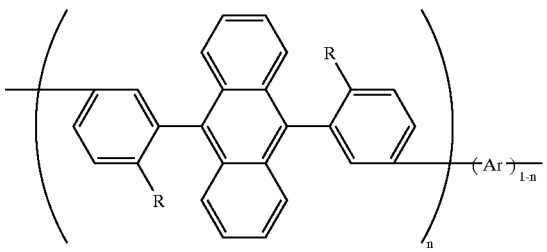

wherein Ar is a $C_{6-26}$ aromatic group, or a $C_{4-14}$ heteroaromatic group which contains at least one heteroatom in the aromatic ring, where the aromatic group and the heteroaromatic group may be unsubstituted or substituted with at least one a $C_{1-12}$ linear, branched or cyclic alkyl group, alkoxy group or amine group; R is a hydrogen atom, a $C_{1-12}$ linear, branchec or cyclic alkyl group or alkoxy group, or a $C_{6-14}$ aromatic group which may be unsubstituted or subtituted with at least one $C_{1-12}$ linear, branched or cyclic alkyl group, alkoxy group or amine group; and n is a real number from 0.01 to 0.99.

2. The blue electroluminescent polymer as set forth in claim 1, wherein the Ar unit is selected from the group consisting of structures represented by the following formulas (2) and (3):

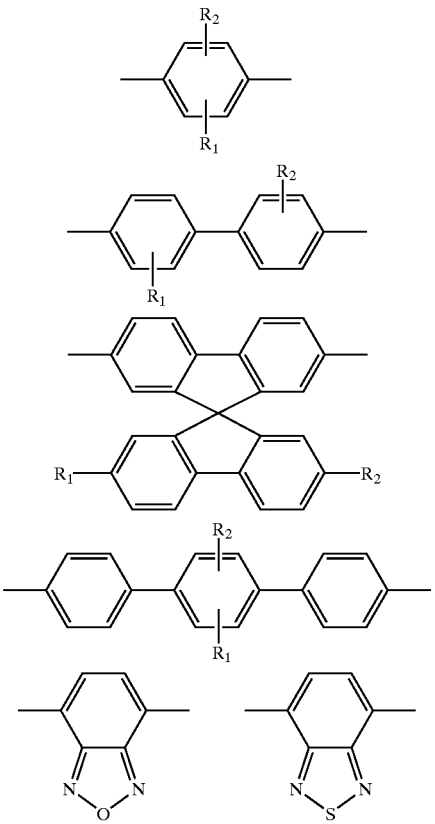

-continued

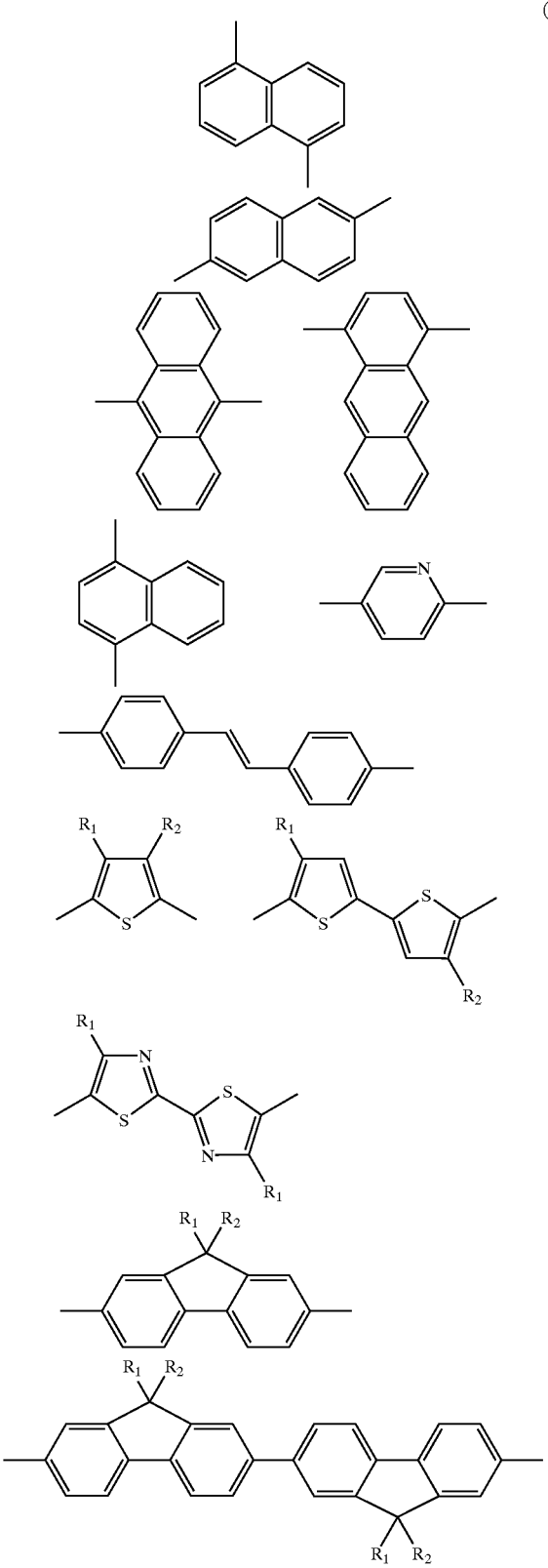

wherein $R_1$ and $R_2$ are independently a $C_{1-12}$ linear, branched or cyclic alkyl group, alkoxy group or amine group.

3. The blue electroluminescent polymer as set forth in claim 2, wherein Ar is anthracene.

4. The blue electroluminescent polymer as set forth in claim 1, wherein the electroluminescent polymer has a number average molecular weight from 10,000 to 200,000, and a molecular weight distribution from about 1.5 to about 5.

5. An organic electroluminescence device comprising the blue electroluminescent polymer as set forth in claim 1 as a light-emitting layer.

6. An organic electroluminescence device as claimed in claim 5, wherein the Ar unit is selected from the group consisting of structures represented by the following formulas (2) and (3):

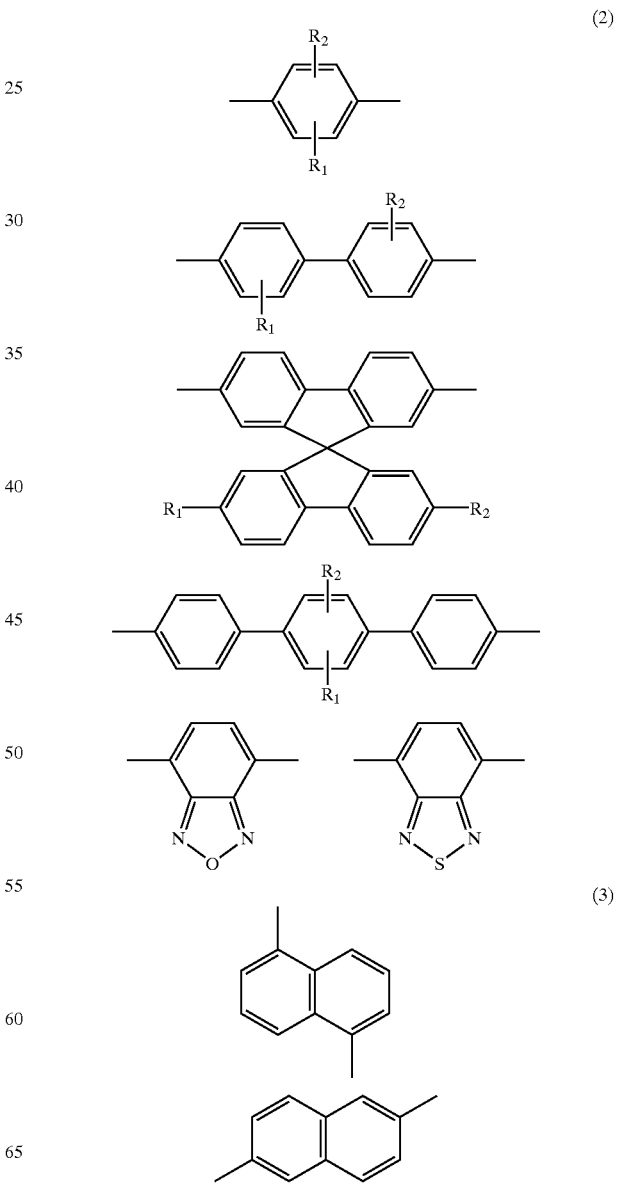

-continued

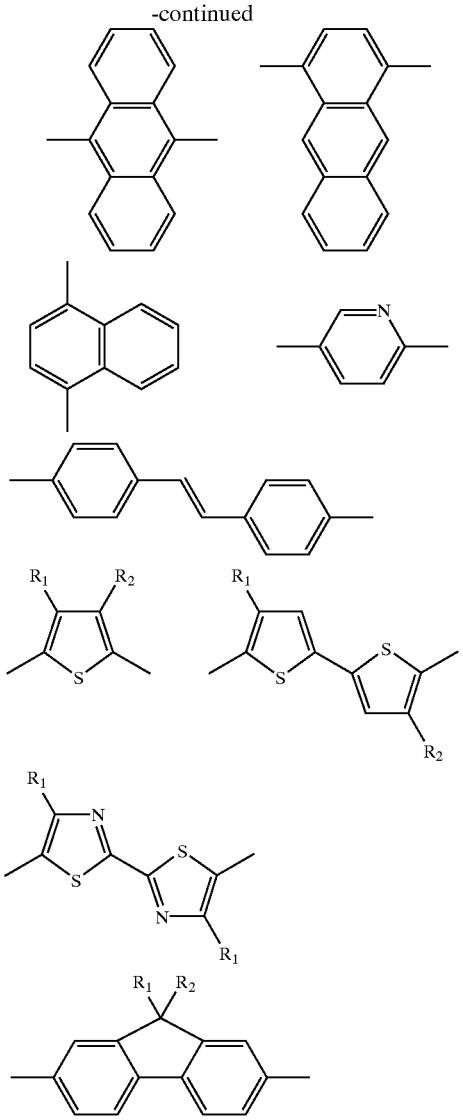

-continued

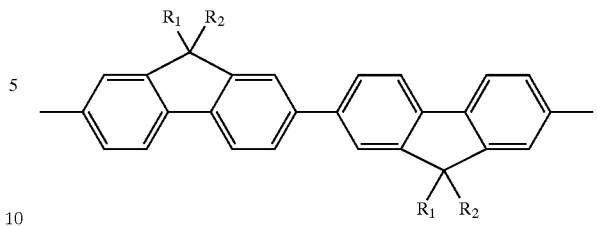

wherein $R_1$ and $R_2$ are independently a $C_{1-12}$ linear, branched or cyclic alkyl group, alkoxy group or amine group.

7. The organic electroluminescence device as set forth in claim 6, wherein Ar is anthracene.

8. The organic electroluminescence device as set forth in claim 5, wherein the electroluminescent polymer has a number average molecular weight from 10,000 to 200,000, and a molecular weight distribution from about 1.5 to about 5.

9. The organic electroluminescence device as claimed in claim 5, wherein the device has a structure selected from the group consisting of anode/light-emitting layer/cathode, anode/buffer layer/light-emitting layer/cathode, anode/hole transport layer/light-emitting layer/cathode, anode/buffer layer/hole transport layer/light-emitting layer/cathode, anode/buffer layer/hole transport layer/light-emitting layer/electron transport layer/cathode, and anode/buffer layer/hole transport layer/light-emitting layer/hole blocking layer/cathode structure.

* * * * *